United States Patent
Wattyn

(10) Patent No.: US 7,124,687 B2
(45) Date of Patent: Oct. 24, 2006

(54) POSITIONING DEVICE, ESPECIALLY FOR OFFSET PLATES

(75) Inventor: Bart Wattyn, Ieper (BE)

(73) Assignee: Strobbe Graphics N.V., Ieper (BE)

( * ) Notice: Subject to any disclaimer, the term of this patent is extended or adjusted under 35 U.S.C. 154(b) by 198 days.

(21) Appl. No.: 10/509,105

(22) PCT Filed: Apr. 26, 2002

(86) PCT No.: PCT/EP02/04848

§ 371 (c)(1), (2), (4) Date: Sep. 27, 2004

(87) PCT Pub. No.: WO03/090969

PCT Pub. Date: Nov. 6, 2003

(65) Prior Publication Data

US 2005/0178230 A1    Aug. 18, 2005

(51) Int. Cl.
*B41F 1/34* (2006.01)
*B23Q 1/25* (2006.01)

(52) U.S. Cl. .................. 101/481; 101/477; 101/485; 101/486; 101/494; 269/73; 269/303; 414/680; 414/744.1; 414/788

(58) Field of Classification Search ............. 101/481, 101/477, 485, 494, 486; 414/788, 680, 744.1; 269/73, 303
See application file for complete search history.

(56) References Cited

U.S. PATENT DOCUMENTS

| | | | |
|---|---|---|---|
| 2,199,170 A * | 4/1940 | Goebel et al. ............... 271/91 |
| 4,790,584 A | 12/1988 | Prentakis | |
| 4,921,237 A * | 5/1990 | Nubson et al. .............. 271/11 |
| 5,497,858 A * | 3/1996 | Cloud et al. ................ 188/67 |
| 5,892,574 A * | 4/1999 | Powers et al. .............. 355/85 |
| 6,305,678 B1 * | 10/2001 | Hammersmith et al. ..... 269/71 |
| 6,323,035 B1 | 11/2001 | Kedar et al. | |

FOREIGN PATENT DOCUMENTS

DE       2201873       8/1972

* cited by examiner

Primary Examiner—Andrew H. Hirshfeld
Assistant Examiner—Marvin P Crenshaw
(74) Attorney, Agent, or Firm—James Creighton Wray

(57) ABSTRACT

The invention relates to a device for positioning an element with respect to at least two reference points (4a, 4c), in which said device acts upon a working point on the element to be positioned and comprises a positioning arm attached to a fixed hinging point with respect to said reference points (4a, 4c), comprising two mutually hinged parts (6a, 6b) allowing a movement of said element to each reference point (4a, 4c). The invention related further to a device for positioning at least one offset plate on a positioning table of a pre-press equipment, comprising means to move the offset plate in a plane parallel to the positioning table to at least one reference point (4a) on the positioning table, in which said means acts upon a working point situated in the supporting plane of the offset plate on the positioning table.

6 Claims, 5 Drawing Sheets

POSITIONING DEVICE, ESPECIALLY FOR OFFSET PLATES

This application claims the benefit of International Application No. PCT/EP02/04848 filed Apr. 26, 2002.

BACKGROUND OF THE INVENTION

The invention relates to a device for positioning at least one offset plate on a positioning table of a pre-press equipment, comprising means to move the offset plate in a plane parallel to the positioning table to at least one reference point on the positioning table, in which said means act upon a working point situated in the supporting plane of the offset plate on the positioning table, in which said means act upon a working point situated in the supporting plane of the offset plate on the positioning table and wherein said means act upon said working point through an aperture in the positioning table.

For the positioning of at least one offset plate on a positioning table of a pre-press equipment, devices are known in which the offset plates are put on the positioning table by means of a loader in the vicinity of three roller shaped reference points. The offset plate is positioned with respect to these three rollers by means of three fingers which are placed facing the rollers and which push the offset plate against these rollers. Once there is contact between the offset plate and the three rollers, the plate is positioned and the plate is kept in its correct position by means of vacuum channels.

These devices has the disadvantage that different positioning tables with different equipment are necessary to position offset plates with different sizes. The positioning system is in that way dependent on the size of the offset plates.

A further disadvantage is that different means are necessary to perform the different movements to the reference points.

A solution to these disadvantages can be found in U.S. Pat. No. 4,790,584, in which a compliant linkage apparatus for providing, in a single stage, three degrees of freedom in a single plane. The apparatus comprises an upper plate, a lower plate under the upper plate, sliding means for allowing the upper and lower plates to slide relative to each other in X, Y, and theta, and orientation means for causing plates to attract each other in a particular orientation to resiliently resist relative lateral and rotational displacements of the plates. The device includes vacuum engagement members which are connected to a vacuum plate for engaging and disengaging the workpiece.

The problem with this apparatus is that it is not applicable on printing plates. The aluminium printing plates have thickness of 0.1 to 0.3 mm. Because of the fact that in this apparatus the workpiece is engaged and disengaged at its top surface through vacuum engagement members, when using printing plates, these printing plates will bend and it is very difficult to get them flat on the supporting surface. Furthermore, the upper layer of the printing plates consist of a very photosensitive emulsion layer, which will be damaged when sucking the printing plates at their top to the vacuum engagement members.

In DE 22 01 873, a device is described for positioning a printing plate which is susceptible for being held in a movable manner by means of a tightening strip, and provided with marking in relation to the cylindrical printing press plate holder which is arranged to receive the tightening strip of an offset press, in particular of a polychrome offset press. There are provided reference markings which, due to the correct position of the printing plate, will coincide with the markings of the printing plate, depending on which reference markings of the tightening strip can be brought into a defined position, in order to tighten the printing plate in a reproducible way in a relatively identical position in relation to the tightening strip. In the second embodiment of this patent application, an adjusting plate is provided which is slidably mounted against a ground plate through means of three micrometer screws. Between the adjusting plate and the ground plate a three-pointed support is provided. The adjusting plate is permanently remained in contact with the micrometer screws by means of a pre-tensioned spring which on the one hand is mounted to the adjusting plate, and on the other hand is mounted to the ground plate. In this device, the printing plate is moved together with the adjusting plate in relation to the ground plate by means of the micrometer screws.

The disadvantage of this device is first of all that a complex projector system is used to check when the reference markings coincide with the markings of the printing plate. Furthermore, also a complex positioning system for the printing plate is provided, using an extra adjusting plate to take care of the correct position of the printing plate. It is not the printing plate itself which is moved in order to make the reference markings coincide with the markings of the printing plate and consequently to bring the printing in a correct position.

The purpose of the invention is to provide in a device for positioning an offset plate on a positioning table of a pre-press equipment which doesn't show the abovementioned disadvantages.

SUMMARY OF THE INVENTION

This purpose is achieved by providing in a device for positioning at least one offset plate on a positioning table of a pre-press equipment, comprising means to move the offset plate in a plane parallel to the positioning table to at least one reference point on the positioning table, in which said means act upon a working point situated in the supporting plane of the offset plate on the positioning table, in which said means act upon a working point situated in the supporting plane of the offset plate on the positioning table, wherein said means act upon said working point through an aperture in the positioning table, wherein at least two reference points are situated on the positioning table and wherein said means comprise a positioning arm which is attached to a fixed hinging point with respect to said reference points, comprising two mutually hinged parts allowing a movement of said element to each reference point.

This has the advantage that on the one hand, offset plates with different sizes can be positioned by the same device and for the performing of the movement of the offset plate to each reference point the same means, i.e. a positioning arm, is provided. On the other hand, the processing time of the positioning device can be shortened when it is compared with the processing time which is necessary in a positioning system which is attached to the loader. In the device according to the invention, the positioning can be performed while the positioning table is moved to the place where the offset plate is illuminated.

In a more specific embodiment of a device according to the invention, the positioning arm comprises a vacuum sucking element to make contact with the element.

In a further more specific embodiment of a device according to the invention, between the two mutually hinged parts a spring is provided to bring the hinged parts back into their original position after the positioning of the element.

In a preferred embodiment of a device according to the invention, said positioning arm comprises a double working cylinder to perform the movement of the positioning arm.

In a more preferred embodiment of a device according to the invention, the positioning arm comprises a suction cup and a second cylinder which provides for an up and down movement of the suction cup.

Preferably, in a device according to the invention the positioning table is provided with two positioning arms to position two offset plates at the same time or to position offset plates with greater size on the positioning table.

This has the advantage that the both positioning arms can be used to push the offset plate against the reference points.

In order to explain the properties of this invention further and in order to specify additional advantages and distinctive features thereof, there now follows a more detailed specification of a device for positioning an element with respect to at least two reference points implemented according to this invention. More specific, a device for positioning at least one offset plate on a positioning table of a pre-press equipment will be described. It is clear that nothing in the following specification may be interpreted as a restriction on the protection claimed for this invention in the claims.

BRIEF DESCRIPTION OF THE DRAWINGS

This invention will be explained on the basis of figures, whereby.

DETAILED DESCRIPTION OF THE PREFERRED EMBODIMENTS

Figure 1A:
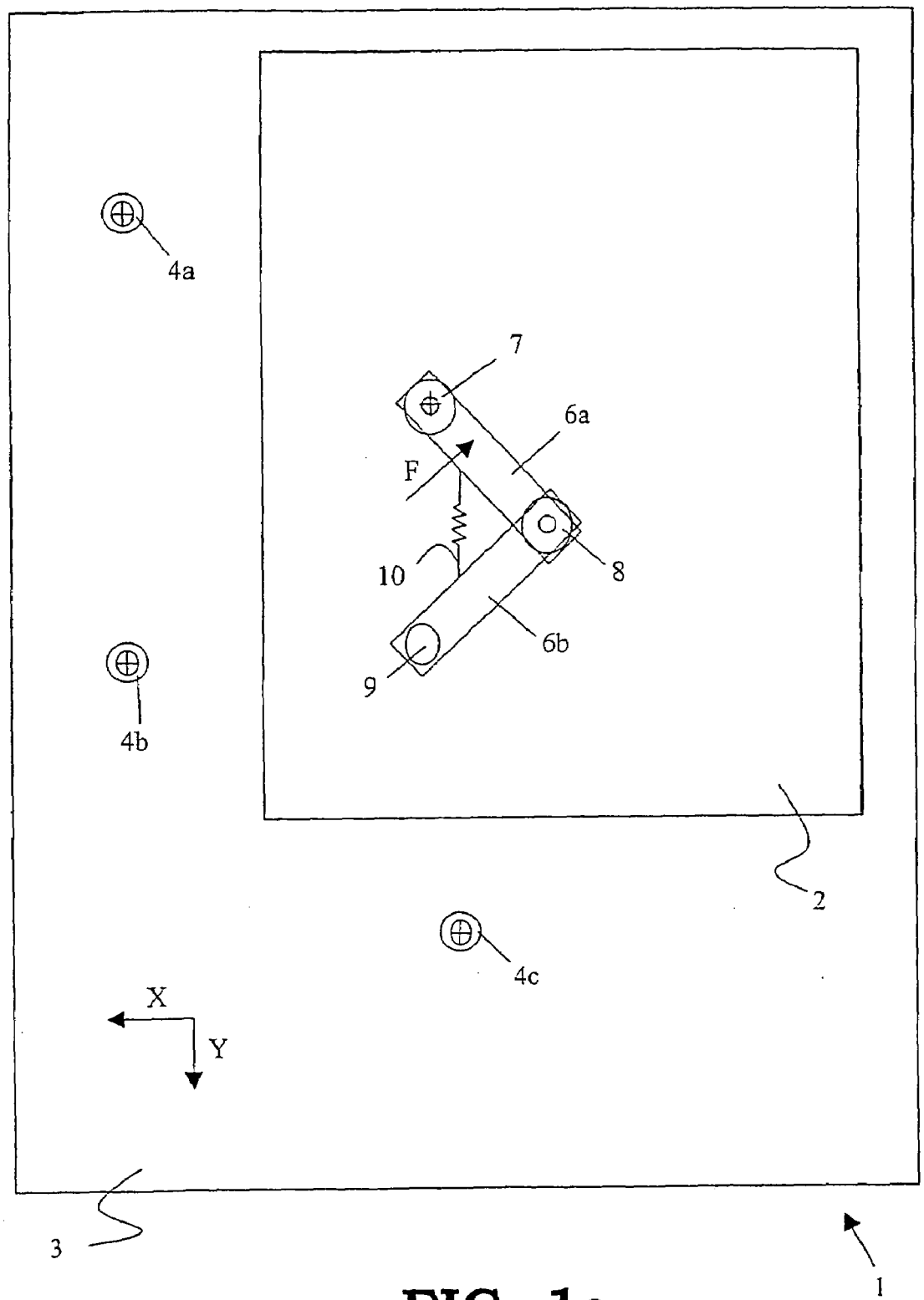
FIGS. 1a to 1c are figures to explain the principle of the positioning arm.
Figure 1B:
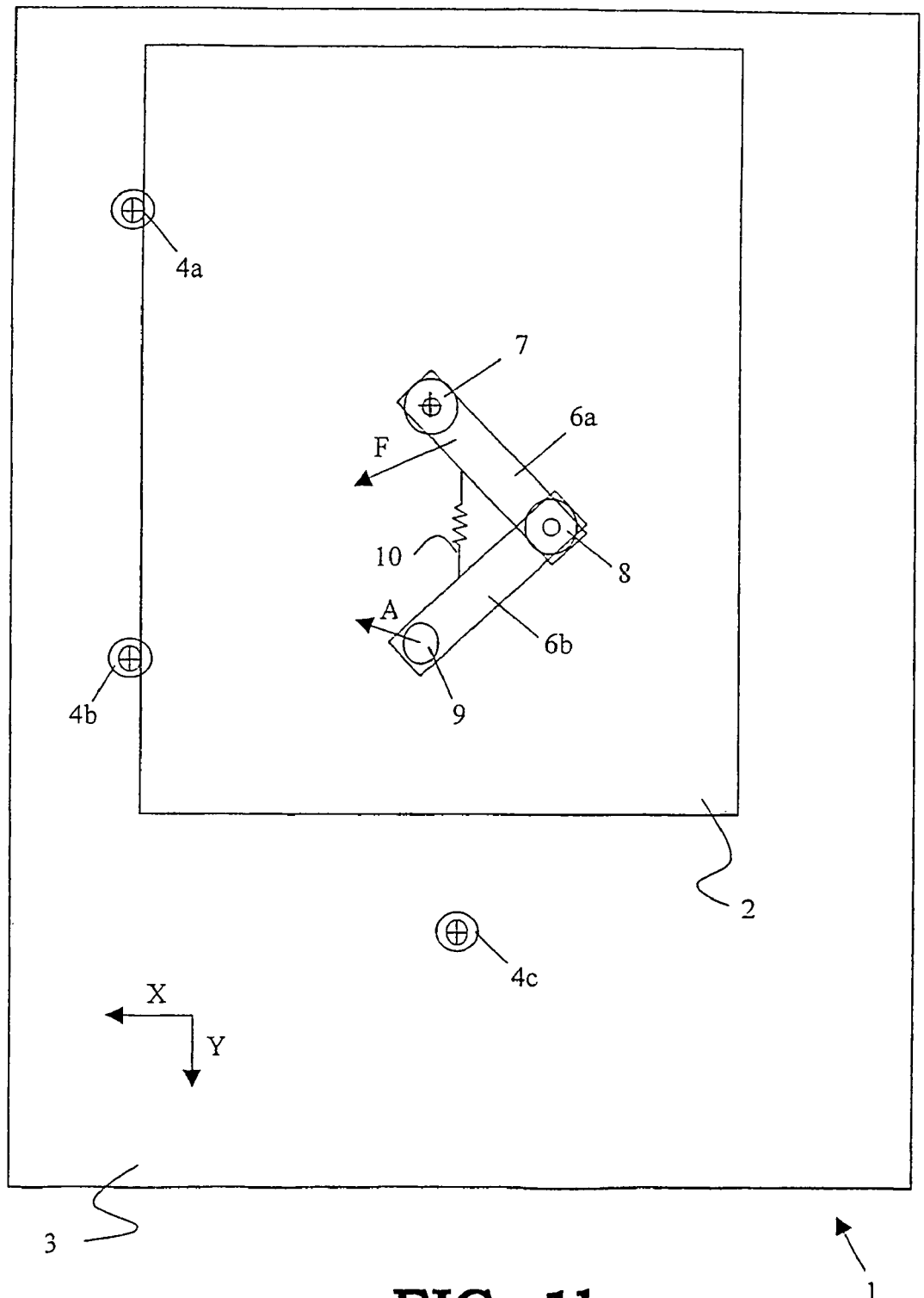
Figure 1C:
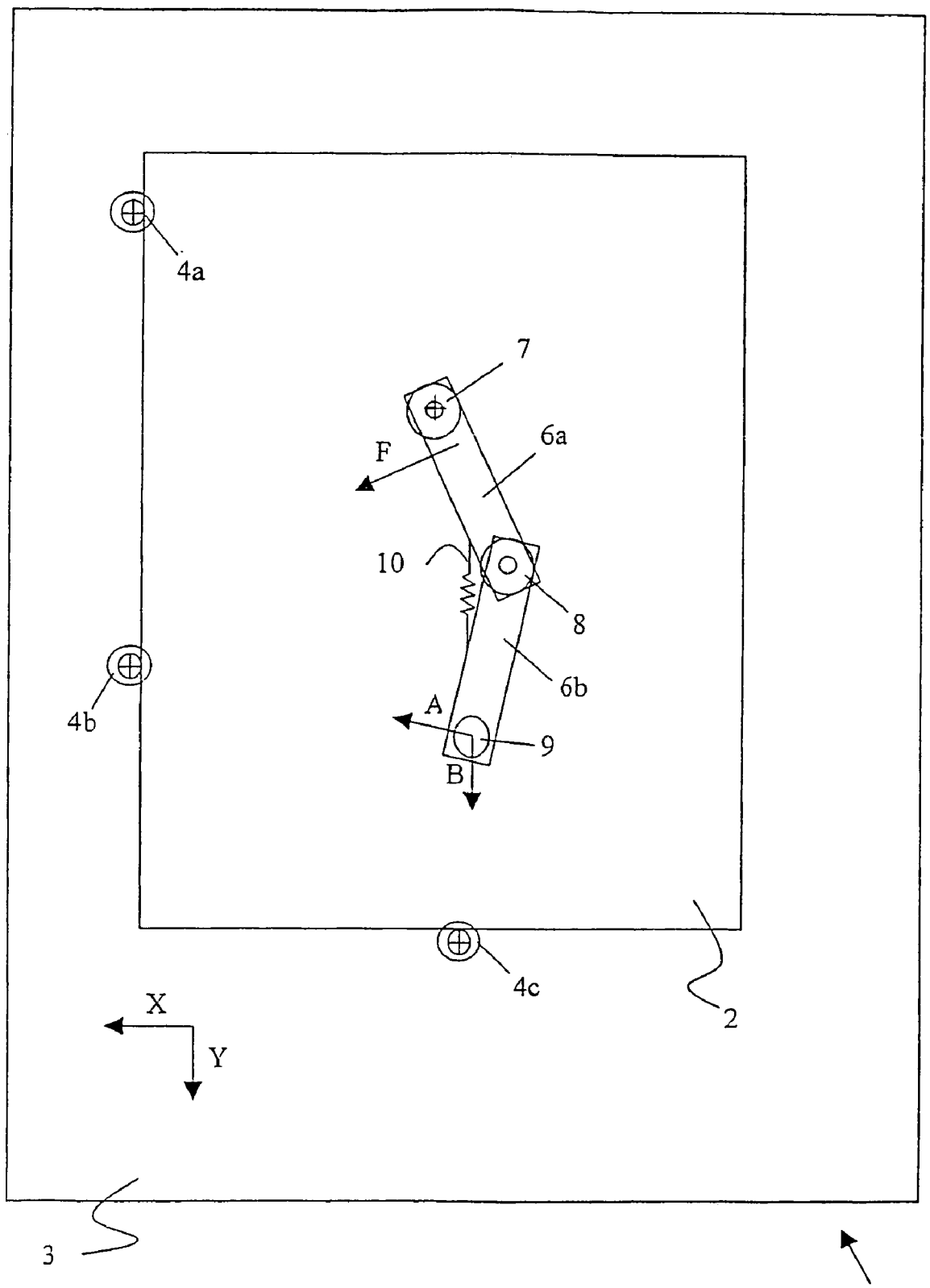

The device (1) for positioning at least one offset plate (2) on a positioning table (3) of a pre-press equipment, as shown in FIGS. 1a to 1c, comprises a loading device (not shown in the figures) which picks up the offset plate out of a cassette or a trolley, and puts the picked up offset plates on a positioning table (3). Thereafter, the offset plates are illuminated with a laser (not shown on the figure). After this illumination process, the offset plate (2) is transported to a online offset plate processor by means of a unloading system (not shown on the figure).

FIGS. 1a, 1b and 1c show the principle for positioning the offset plate (2) on the positioning table (3).

Figure 2:
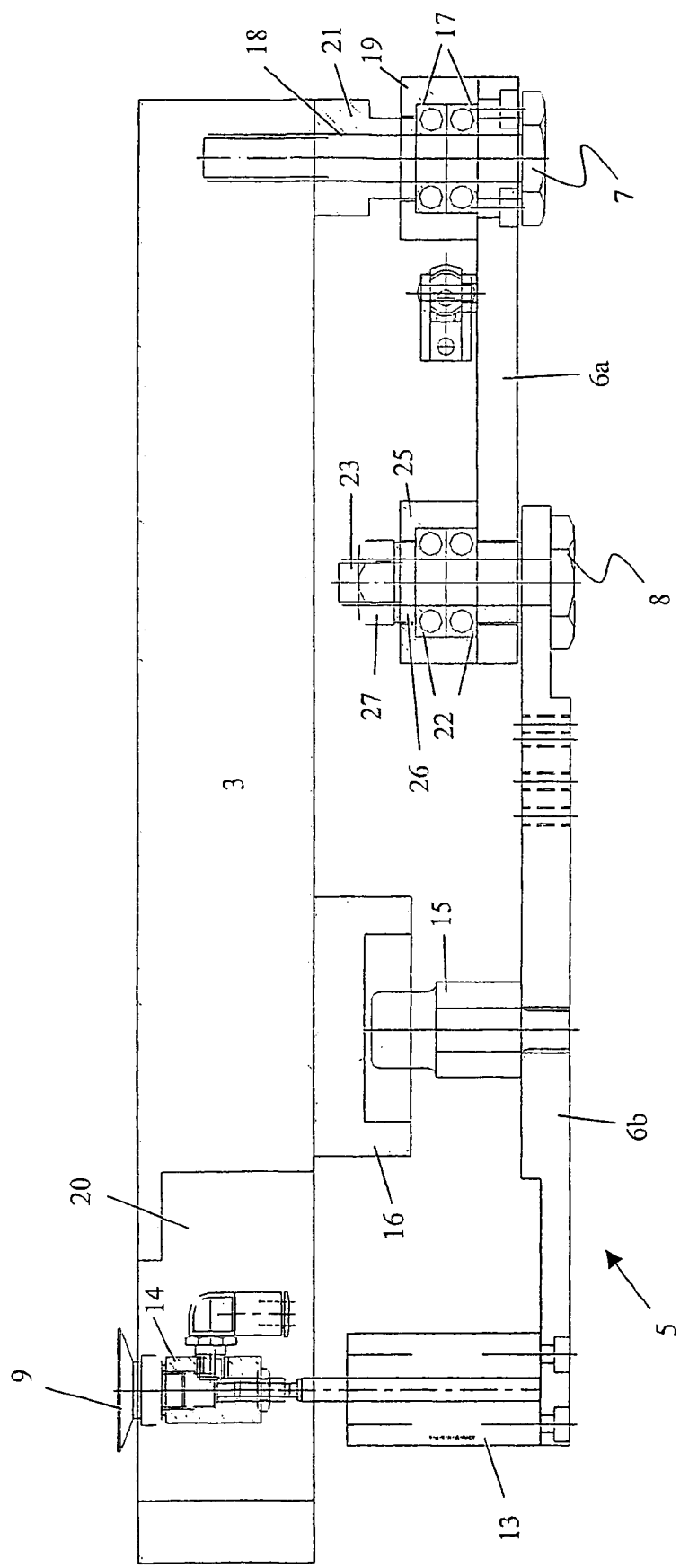
FIG. 2 is a cross-sectional view of a positioning arm which is arm attached to the positioning table.

On the positioning table (3), three roller shaped reference points (4a, 4b, 4c) (hereafter called rollers) are provided. Further, a positioning arm (5) is provided to move the offset plate against the rollers (4a, 4b, 4c). The positioning arm (5) consists of two mutually hinged parts, i.e. a first (6a) and a second hinged part (6b), allowing a movement of the offset plate (2) to each roller (4a, 4b, 4c). The first part (6a) of the positioning arm (5) is attached to a fixed hinging point (7) which is provided to the positioning table (3). The two hinged parts (6a, 6b) are mutually hinged to each other in a floating hinging point (8). The second part (6b) of the positioning arm (5) is provided with a vacuum sucking element (9) which can move in an aperture (20) (shown in FIG. 2 in the positioning table (3). In that way, the vacuum suction cup (9) can make contact with the offset plate (2).

Between the two hinged parts (6a, 6b) a spring (10) is provided to bring the two second hinged part (6b) back into its original position after the positioning of the offset plate (2).

The offset plate (2) always have to be positioned against the three rollers (4a, 4b, 4c) with a small tolerance of some μm. After the loading of the offset plate (2) on the positioning table (3) in the vicinity of the rollers (4a, 4b, 4c), the positioning arm (5) has to suck the offset plate (2) by means of the vacuum sucking element (9) which can move in the aperture (20) in the positioning table (3). Thereafter, a force F is exerted on the positioning arm (5), as shown in FIG. 1b. Because of that, the positioning arm (5) will rotate around the fixed hinging point (7) and the offset plate (2) is pushed or dragged with force A against the first two rollers (4a, 4b). Once the offset plate (2) is positioned with respect to these two rollers (4a, 4b), the positioning arm (5) will rotate around the fixed hinging point (7), but also around the floating hinging point (8) through which the offset plate (2) is moved with force B in the Y-direction. In that way, the spring (10) is stretched. Once the offset plate (3) is positioned against the third roller (4c), the positioning arm (5) blocks and stays in the same position. Thereafter, the offset plate (2) is sucked to the positioning table (3) by means of vacuum channels (not shown on the figure) through which it remains in its position. The suction cup (9) which moves the offset plate (2) is now placed in a vacuumless position and the positioning arm (5) is moved back to its original position (as shown in FIG. 1a) by exorting force F in the other direction.

By using this principle, two movements (A, B) in two different directions are performed through the same means, i.e. the positioning arm (5). Furthermore, the suction cup (9) acts upon a working point situated in the supporting plane of the offset plate on the positioning table (3). The offset plate (2) is accordingly not moved through sidewardly pushing, but is moved through sucking the underside of the offset plate (2) and moving it to the correct position by means of the positioning arm (5).

Figure 3:
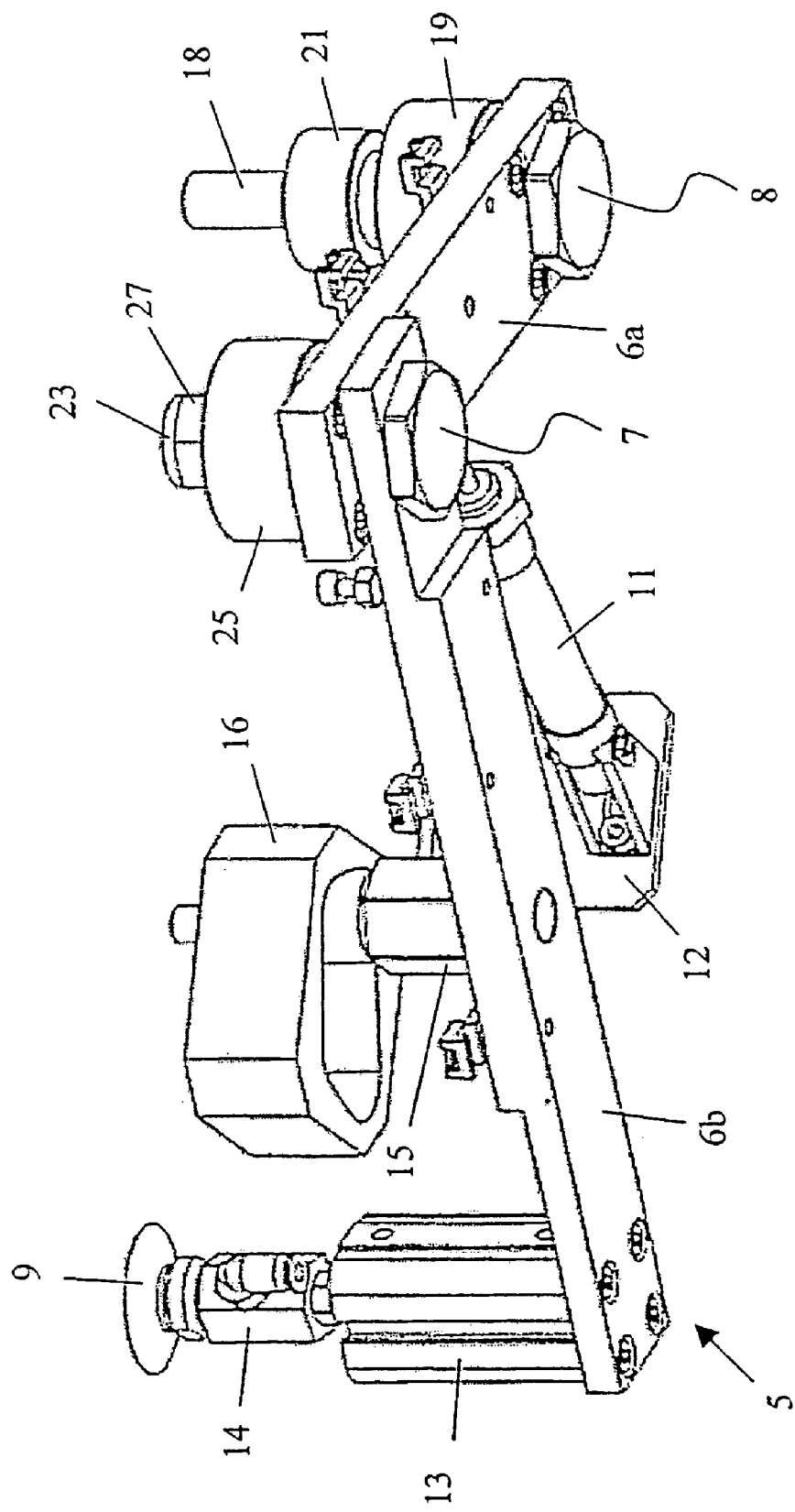
FIG. 3 is a perspective view of the positioning arm as shown in FIG. 2.

The movement of the positioning arm (5) (shown in detail in FIGS. 2 and 3) is performed through a double working cylinder (11). While the offset plate (2) is positioned, the cylinder (11) is retracted through which the positioning arm (5) can rotate around the hinging points (7, 8). After the positioning, the cylinder is pushed outwardly while the spring (not shown on the FIGS. 2 and 3) brings the hinged parts (6a, 6b) back into their original position, in which a hook of 90° is formed between the hinged parts (6a, 6b). The double working cylinder (11) is hinged attached, at one end by means of the coupling piece (12) and at the other end through a rod eye (not visible on the figure).

The positioning arm (5) is further provided with a second cylinder (13) which provides for the up and down movement of the suction cap (9). The suction cap (9) is coupled to the rod of the second cylinder (13) by means of a vacuum coupling piece (14). In this way, vacuum can be connected to the suction cap (9). After placing the offset plate (2) in the vicinity of the rollers, the second cylinder (13) pushes up the suction cap (9), whereafter the suction cap is sucked vacuum and the offset plate (2) is pushed against the rollers (4a, 4b, 4c). Subsequently, vacuum channels in the positioning table (3) provide that the offset plate (2) stays in its correct position. Thereafter, the suction cap (9) is put in a vacuumless condition and the second cylinder (13) moves again downwards so as to be situated under the surface of the positioning table (3).

The freedom of movement of the positioning arm (5) is limited because of a bearing holder (15) which can move in a stop block (16). These two elements determine the maximum movement space of the offset plate (2) in the X- and Y-direction and provide that the hook between the two hinged parts (6a, 6b) can not be smaller than 90°.

The fixed hinging point (7) is formed through two ball bearings (17), a fastening bolt (18), a bearing house (19) and a fastening ring (21). The fastening bolt (18) is screwed in in the underside of the positioning table (3).

The floating hinging point (8) is formed through two ball bearings (22), a fastening bolt (23), a coupling ring (24), a bearing house (25), an intermediate ring (26) and a self-locking nut (27).

Normally, two positioning arms (5) are provided on the positioning table (3) as to illuminate two offset plates (2) at the same time. If offset plates (2) with a greater size have to illuminated, there is only space for one offset plate (2) on the positioning table (3). To position such offset plates (2), both positioning arms (5) can be used to push the offset plate (2) against the rollers (4a, 4b and 4c).

The invention claimed is:

1. Device for positioning at least one offset plate on a positioning table of a pre-press equipment, comprising means to move the offset plate in a plane parallel to the positioning table to at least one reference point (4a) on the positioning table, in which said means act upon a working point situated in the supporting plane of the offset plate on the positioning table, wherein said means act upon said working point through an aperture in the positioning table, wherein at least two reference points (4a, 4c) are situated on the positioning table and wherein said means comprise a positioning arm which is attached to a fixed hinging point with respect to said reference points (4a, 4b), comprising two mutually hinged parts (6a, 6b) allowing a movement of said element to each reference point (4a, 4c).

2. Device according to claim 1, wherein the positioning arm comprises a vacuum sucking element to make contact with the offset plate.

3. Device according to claim 2, wherein between the two mutually hinged parts (6a, 6b) a spring is provided to bring the first and second hinged part (6b) back into their original position after the positioning of the offset plate.

4. Device according to claim 1, wherein said positioning arm comprises a double working cylinder to perform the movement of the positioning arm.

5. Device according to claim 1, wherein the positioning arm comprises a suction cup and a second cylinder which provides for an up and down movement of the suction cup.

6. Device according to claim 1, wherein the positioning table is provided with two positioning arms to position two offset plates at the same time or to position offset plates with greater size on the positioning table.

* * * * *